United States Patent
Ribeiro et al.

(10) Patent No.: US 7,324,346 B2
(45) Date of Patent: Jan. 29, 2008

(54) PLUG-IN MODULE FOR PORTABLE COMPUTING DEVICE

(75) Inventors: Durval S. Ribeiro, Owatonna, MN (US); Kurt Raichle, Owatonna, MN (US)

(73) Assignee: SPX Corporation, Charlotte, NC (US)

( * ) Notice: Subject to any disclaimer, the term of this patent is extended or adjusted under 35 U.S.C. 154(b) by 6 days.

(21) Appl. No.: 11/217,466

(22) Filed: Sep. 2, 2005

(65) Prior Publication Data
US 2006/0023429 A1 Feb. 2, 2006

(51) Int. Cl.
*H05K 7/00* (2006.01)
(52) U.S. Cl. .................. 361/728; 361/752; 361/715
(58) Field of Classification Search .......... 361/730, 361/732, 733, 747, 686, 715, 752, 790, 800; 455/575.1, 575.2–575.9, 575
See application file for complete search history.

(56) References Cited

U.S. PATENT DOCUMENTS

| | | | | |
|---|---|---|---|---|
| 4,399,487 A | | 8/1983 | Neumann .................. 361/391 |
| 5,016,845 A | | 5/1991 | Pellegrino .................. 248/104 |
| RE34,369 E | | 9/1993 | Darden et al. .............. 439/377 |
| 5,373,149 A | | 12/1994 | Rasmussen ................. 235/492 |
| 5,414,253 A | * | 5/1995 | Baudouin et al. ........... 235/492 |
| 5,442,512 A | * | 8/1995 | Bradbury .................... 361/683 |
| 5,684,673 A | | 11/1997 | Shibasaki et al. ........... 361/686 |
| 5,687,387 A | * | 11/1997 | Endejan et al. ................ 710/2 |
| 5,801,922 A | * | 9/1998 | Shen et al. .................. 361/686 |
| 5,857,201 A | * | 1/1999 | Wright et al. ............. 707/104.1 |
| 5,864,463 A | | 1/1999 | Tsukada et al. ............. 361/684 |
| 5,963,872 A | | 10/1999 | Stein .......................... 455/557 |
| 5,995,621 A | | 11/1999 | Bryant et al. ........... 379/428.04 |
| 6,038,130 A | * | 3/2000 | Boeck et al. ................. 361/735 |
| 6,049,450 A | * | 4/2000 | Cho et al. .................... 361/683 |
| 6,091,571 A | | 7/2000 | Hanson .................... 360/98.04 |
| 6,112,273 A | * | 8/2000 | Kau et al. .................... 710/260 |
| 6,122,175 A | | 9/2000 | Shieh .......................... 361/736 |
| 6,166,917 A | | 12/2000 | Anderson .................... 361/752 |
| 6,176,724 B1 | | 1/2001 | Klatt et al. .................. 439/326 |
| 6,185,095 B1 | | 2/2001 | Helot et al. ............... 312/223.1 |
| 6,205,021 B1 | | 3/2001 | Klein et al. .................. 345/167 |
| 6,219,232 B1 | | 4/2001 | Bang et al. ............... 312/223.2 |
| 6,231,371 B1 | * | 5/2001 | Helot .......................... 439/374 |
| 6,321,340 B1 | * | 11/2001 | Shin et al. ................... 713/310 |
| 6,351,388 B1 | * | 2/2002 | Jenkins et al. .............. 361/730 |

(Continued)

*Primary Examiner*—Tuan T. Dinh
*Assistant Examiner*—Hung S Bui
(74) *Attorney, Agent, or Firm*—Baker & Hostetler LLP

(57) ABSTRACT

A plug-in module adds functionality to a portable electronic device. The module includes a housing that is accepted by a housing port of the portable electronic device. The module includes at least one latch to secure the module to the electronic device. Each latch includes a first member, a second member, and a third member. The housing includes at least one receptacle corresponding to each latch. The receptacles are sized and positioned to accept a member of the latch and direct the latch to a groove located on the portable electronic device. Optionally, the latch includes a slip-resistant surface sized to accept a human finger or thumb. The module also preferably includes a hardware interface connector sized and positioned within the housing to engage a 120-pin hardware interface port on the portable electronic device when the module housing is positioned on the housing port of the portable electronic device. Receptacles of the electric connector have certain functionality corresponding to the pins on the port.

20 Claims, 7 Drawing Sheets

U.S. PATENT DOCUMENTS

| | | | |
|---|---|---|---|
| 6,407,914 B1 | 6/2002 | Helot | 361/686 |
| 6,424,722 B1 | 7/2002 | Hagen et al. | 381/314 |
| 6,538,880 B1 * | 3/2003 | Kamijo et al. | 361/686 |
| 6,641,533 B2 * | 11/2003 | Causey et al. | 600/300 |
| 6,654,842 B1 | 11/2003 | Park | 710/302 |
| 6,716,103 B1 * | 4/2004 | Eck et al. | 463/45 |
| 6,743,104 B1 | 6/2004 | Ota et al. | 463/44 |
| 6,757,165 B2 * | 6/2004 | Fujiki et al. | 361/686 |
| 6,760,217 B2 * | 7/2004 | Tsai | 361/683 |
| 6,894,902 B2 * | 5/2005 | Chang | 361/715 |
| 6,898,078 B2 * | 5/2005 | Kamimaki et al. | 361/686 |
| 6,961,237 B2 * | 11/2005 | Dickie | 361/683 |

* cited by examiner

PLUG-IN MODULE FOR PORTABLE COMPUTING DEVICE

CLAIM OF PRIORITY

This application claims priority to the provisional application Ser. No. 60/240,859 entitled "Plug-In Module for Portable Computing Device," filed Oct. 17, 2000, the disclosure of which is hereby incorporated by reference in its entirety.

FIELD OF THE INVENTION

The present invention relates generally to an apparatus for adding functionality to a portable computing device. More particularly, the present invention relates to a plug-in module for use with a portable computing device. The module may include a latching mechanism to secure the module to the apparatus, a pin or hole connector designed to transfer data, signals, or other communications between the plug-in module and the portable computing device, and optionally other functionality.

BACKGROUND OF THE INVENTION

Computing devices, such as personal computers, main frames, lap top computers, pocket PCs, personal digital assistants, portable analog or digital analyzers, and the like provide users with specific functionality based on the design and features of the device. As technology, usage patterns, and user requirements change, users may desire to add additional functionality to a portable computing device. Such devices are particularly desirable in connection with portable diagnostic equipment, such as analog or digital analyzers. For example, a diagnostic device such as an engine analyzer may serve to collect and analyze multiple aspects of an engine or vehicle, including aspects of vehicle operation such as emissions component, system pressure, fluid pressure, system temperature, and other aspects of conditions.

However, the prior art plug-in modules do not provide functionality to all types of electronic devices. For example, a plug-in module is not available that securely attaches to, and interfaces with, certain portable electronic devices having a 120-pin or 120-receptacle hardware interface port.

If a module were available that could interface with such a portable electronic or computing device, the device could receive additional memory, software, features, hardware and functionality. Such a module may also facilitate the use of software, features and functionality for other portable computing devices, as well as previous versions of portable computing devices. In addition, it is desirable that such a module latch onto the portable computing device so that it does not fall off of the device when transported, but that the module also be easily removable when it is not needed, or when a replacement module is desired.

It is therefore desirable to provide an improved plug-in module for a portable electronic or computing device.

SUMMARY OF THE INVENTION

It is therefore a feature and advantage of the present invention to provide an improved plug-in module for a portable electronic or computing device.

The above and other features and advantages are achieved through the use of a novel plug-in module as herein disclosed. In accordance with one embodiment of the invention, a plug-in module adds functionality to a portable electronic device. The module includes a housing that is of a size appropriate to be accepted by a housing port of the portable electronic device. Each latch includes a first member, a second member, and a third member, and each member has a first end and a second end. The first end of the first member is connected to the first end of the second member such that the first and second members form an angle of between 60° and 130°. The second end of the first member is connected to the first end of the third member such that the first and third members form an angle of between 60° and 130°. The housing includes at least one receptacle corresponding to each latch. The receptacles are sized and positioned to accept a latch and direct the latch to a groove, such as a notch, located on the portable electronic device so that the third member of the latch mates with the groove or notch and secures the housing to the portable electronic device.

Optionally, the latch includes a slip-resistant surface, sized to accept a human finger or thumb. Such a slip-resistant surface may be connected to the second end of the second member of the latch. Also optionally, the latch includes a notch positioned substantially at the point where the first member connects to the second member. The notch of the latch is sized and positioned to engage a raised portion or rib located on the interior surface of the housing when the latch is inserted into the receptacle and positioned to mate with the groove or notch of the housing.

The embodiment also optionally includes a hardware interface connector sized and positioned within the housing to engage a hardware interface port on the portable electronic device when the module housing is positioned on the housing port of the portable electronic device. The hardware interface port and hardware interface connector comprise 120-pin or 120-receptacle connectors or ports.

In accordance with another embodiment of the present invention, an apparatus for adding functionality to a portable electronic device includes a housing sized to be accepted by a housing port of a portable electronic device. The housing includes an interior portion, and a hardware interface connector is positioned within the interior portion so that it may be accepted by a hardware interface port on the portable electronic device. The interface connector has between 1 and 120 receptacles sized and positioned to mate with and correspond to one or more pins of a hardware interface port on the portable electronic device. The receptacles on the connector form two rows in parallel such that each receptacle is positioned to be numbered corresponding to its position in one of the rows. One of the two rows includes receptacle positions 1 through 60, and the other of the two rows includes receptacle positions 61 through 120. Receptacle positions 1 and 61 are located at corresponding ends of each row, and receptacle positions 60 and 120 are located at the other corresponding ends of each row. Receptacle positions 1 and 120 are located at opposite ends of each row, and receptacle positions 60 and 61 are also located at opposite ends of each row.

In accordance with another embodiment of the present invention, at least one of the receptacles corresponds to at least one of positions 3, 5, 7, 9, 11, 15, 19, 23, 27, 31, 35, 39, 47, 51, 55, 59, 63, 67, 71, 75, 79, 83, 87, 91, 95, 99, 103, 107, 109, 115, 117, and 119, and such receptacle or receptacles correspond to an electrical ground.

In accordance with another embodiment of the present invention, at least one of the receptacles corresponds to at least one of positions 111, 112, 113, 114, 116, 118, and 120, and such receptacle or receptacles relate to power.

In accordance with another embodiment of the present invention, at least one of the receptacles corresponds to at least one of positions 3, 5, 7, 9, 11, 15, 19, 23, 27, 31, 35, 39, 47, 51, 55, 59, 63, 67, 71, 75, 79, 83, 87, 91, 95, 99, 103, 107, 109, 115, 117, and 119, and such receptacle or receptacles correspond to an electrical ground.

In accordance with another embodiment of the present invention at least one of the receptacles corresponds to at least one of positions 90, 92, 93, 96, 97, 100, 101, 102, 104, and 105, and such receptacle or receptacles correspond to a microprocessor discrete input/output.

In accordance with another embodiment of the present invention at least one of the receptacles corresponds to at least one of positions 2, 4, 6, 8, 10, 12-14, 16-18, 20-22, 24-26, 28-30, 32-34, 36-38 and 40, and such receptacle or receptacles correspond to a field programmable gate array (FPGA) discrete input/output.

There has thus been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein, and the abstract set forth below, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION OF PREFERRED EMBODIMENTS OF THE INVENTION

The present invention provides an improved plug-in module for a portable electronic device, such as a portable computer, pocket PC, personal digital assistant, analog or digital analyzer, electronic game, or other electronic device. The module may include a computer processor or memory storing program instructions for adding functionality to the electronic apparatus, or the module may include hardware to accept a computer memory containing computer program instructions and deliver such instructions to the electronic device or to add processing capability to the device.

Figure 1:
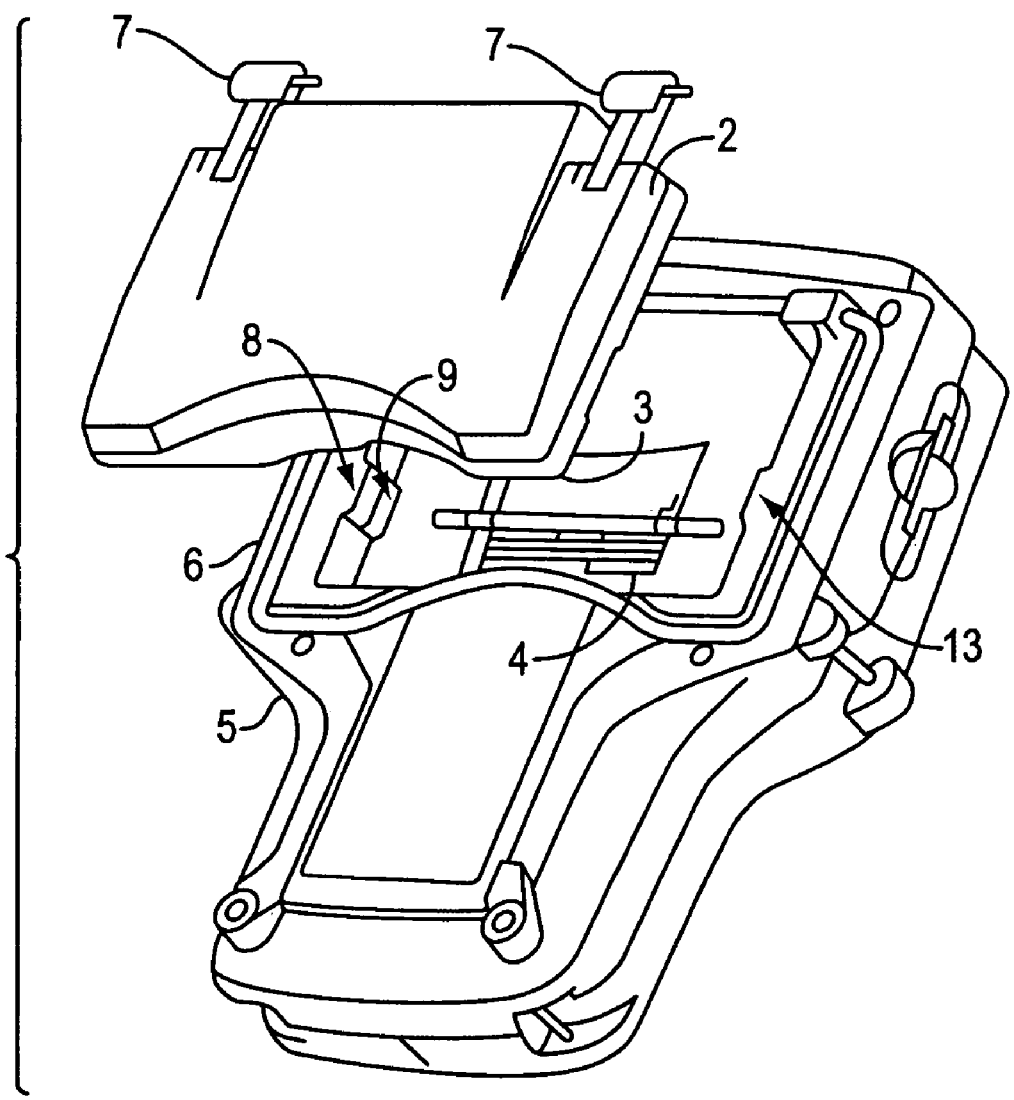
FIG. 1 illustrates an exemplary portable electronic device and plug-in module in accordance with the present invention.

FIG. 1 illustrates an exemplary embodiment of the present inventive plug-in module for a portable electronic device. Referring to FIG. 1, a portable electronic device 5 includes a module port 6 that may accept a plug-in module 2. The electronic device illustrated in FIG. 1 is a portable engine analyzer, such as that which may be used to measure and analyze various aspects of the operation of a vehicle. However, the electronic device may in fact be any type of analyzer or other type of portable electronic or computing device such as a pocket PC or a personal digital assistant, a remote control, an electronic game, or any other portable electronic device. The electronic apparatus includes a hardware interface port 4 such as a 120-pin or 120-receptacle connector to provide an interface between the plug-in module and the electronic device via a connector located on the underside 3 of module 2. The plug-in module 2 maters with the module port 6 of the electronic device. The module port 6 includes one or more extensions such as 8 and 13 that form grooves or notches such as 9 within the port. The module includes a means to secure the module 2 to the device 5 such as one or more latches 7 that secure the module 2 to the electronic device 5 during normal operation.

The electronic device illustrated in FIG. 1 is a vehicle engine analyzer. Such an analyzer may serve to collect and analyze multiple aspects of an engine or vehicle, including aspects of the vehicle operations such as emissions components, system pressure, fluid pressure, system temperature, and other aspects or conditions. However, if the analyzer cannot provide all of the above functions, or if it is desirable to add a different type of functionality to the analyzer such as the ability to measure amps, vibration, or other aspects, the plug-in module may include a computer program memory containing computer program instructions that instruct the electronic apparatus to perform such functions. The module may also provide processing hardware that can be used by the electronic device when performing such functions. Such memory and/or processing hardware may be included in the module itself, or the module may simply contain communications hardware that provides an interface between the hardware interface port of the portable electronic device and an external memory or processor.

Figure 2:
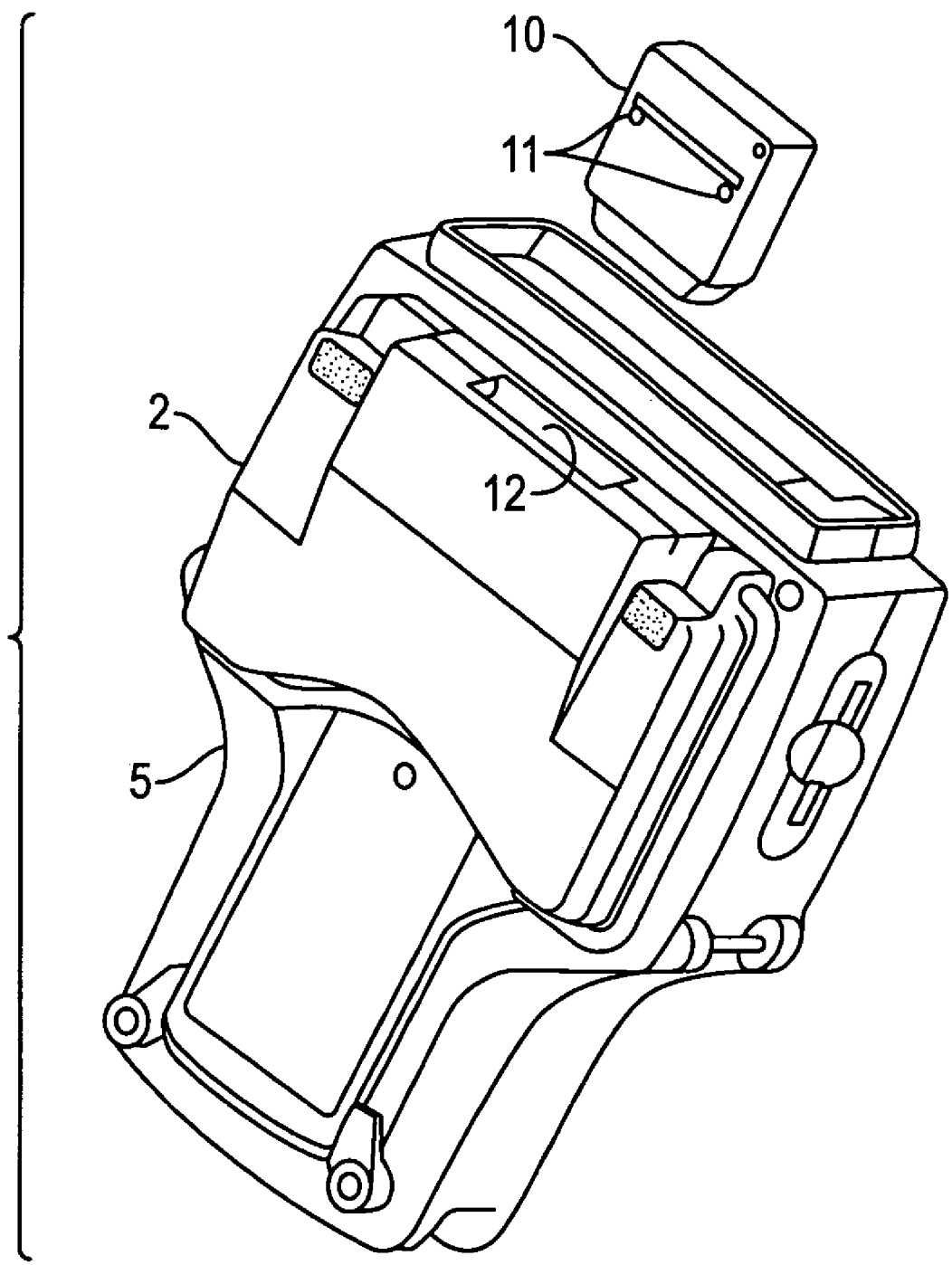
FIG. 2 illustrates the portable electronic device in FIG. 1 with an alternate embodiment of the plug-in module.

FIG. 2 illustrates an exemplary embodiment of an arrangement where the module serves as an interface between a separate memory or processing cartridge and the electronic device. Referring to FIG. 2, plug-in module 2 is connected to portable electronic device 5. The module 2 includes a port 12 that accepts an external cartridge 10. On the surface of cartridge 10 are notches 11 that are sized and positioned to engage raised ribs located on the interior surface of port 12. Cartridge 10 includes a computer processor and/or computer memory that adds functionality to the electronic device 5.

Figure 3:
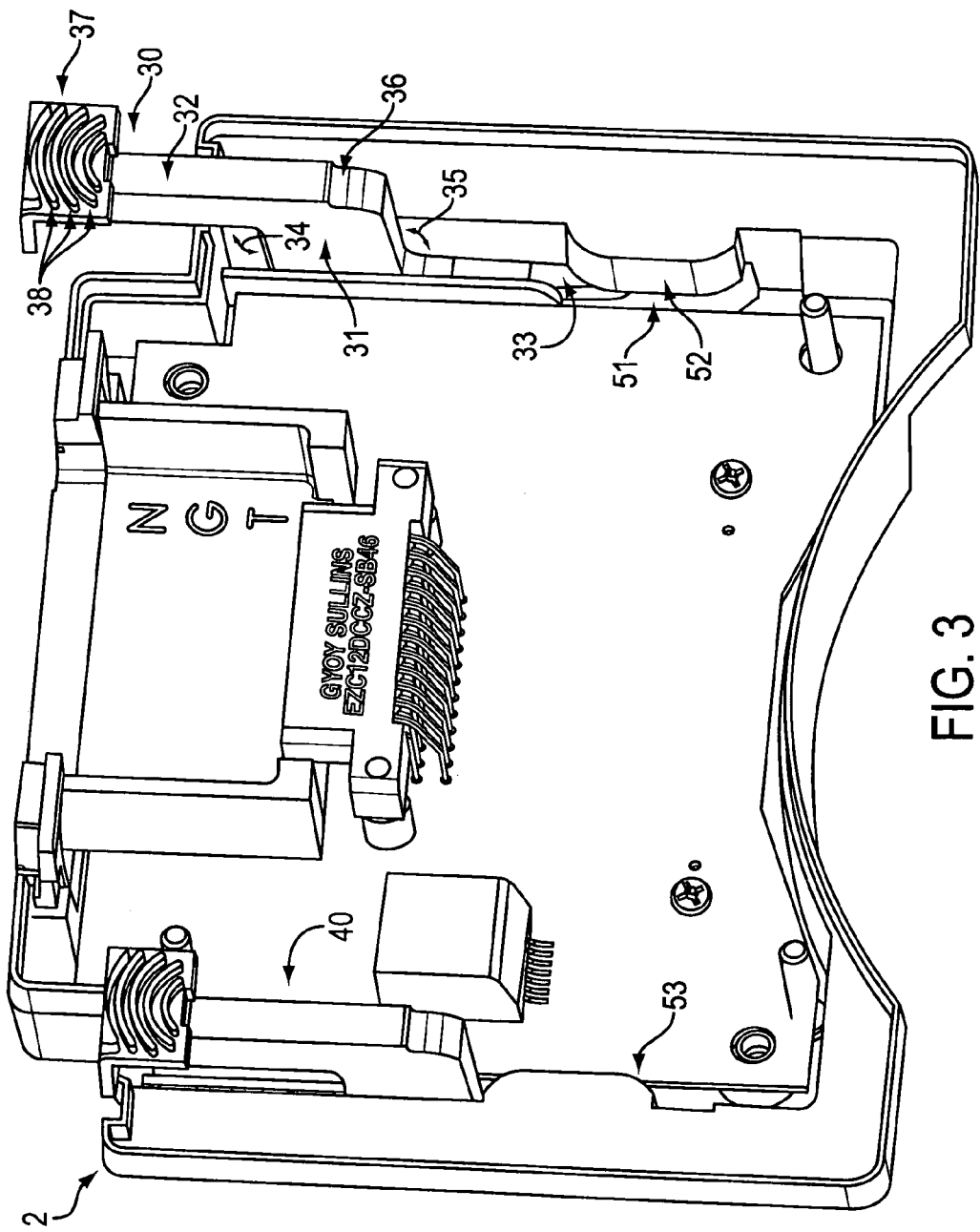
FIG. 3 is a cut-away perspective view illustrating a preferred embodiment of the latching of the plug-in module to an electronic device.

FIG. 3 illustrates an exemplary latch and its use to secure the plug-in module to an electronic device. Referring to FIG.

3, one end of a first member 31 is connected to an end of a second member 32, and the other end of the first member 31 is connected to an end of a third member 33 to form the latch 30. The members are connected such that the angles 34 and 35 made by the connection of the members are between 60° and 130°. Preferably, first member 31 is substantially perpendicular to the second member 32 and third member 33. Also preferably, the second member 32 and third member 33 are substantially parallel to each other. The latch 30 may include a notch 36 positioned to mate with a raised surface or rib located within the housing of the plug-in module. The third member 33 is sized to fit within a groove 51 located on the plug-in module. Latch 30 optionally includes a finger rest 37 sized to receive a human finger or thumb to facilitate insertion of the latch 30 into the plug-in module. Preferably and optionally, the finger rest 37 includes a slip resistant portion such as one or more ribs 38 that reduce the likelihood that a finger will slip on the finger rest 37 when engaging the latch 30.

FIG. 3 is a cut-away illustration, illustrating two latches 30 and 40 and a portion of the module 2 so that the position of the latches within the module and in reference to the electronic device may be understood. Referring again to FIG. 3, at least one latch such as 30 and/or 40 is inserted into a plug-in module 2 to secure the module 2 to a portable electronic device such as that identified as 5 in FIG. 1. Referring to FIG. 3, the module includes at least one receptacle or groove 51 formed by a cap such as 52 or 53. The groove 51 is sized and positioned to receive the third member 33 of a latch 30 when the latch 30 is inserted into the plug in module. Referring to FIGS. 1 and 3, when the module 2 is attached to the device 5 the groove or grooves 51 in the module 2 receive the latch 30, and the third member 33 of the latch is directed to the notch or notches 9 of the device 5 to secure the module 2 to the device 5. FIG. 3 illustrates latch 30 before it is fully inserted into the module and groove 51, and latch 40 after it is inserted into the groove formed by cap 53.

Figure 4:
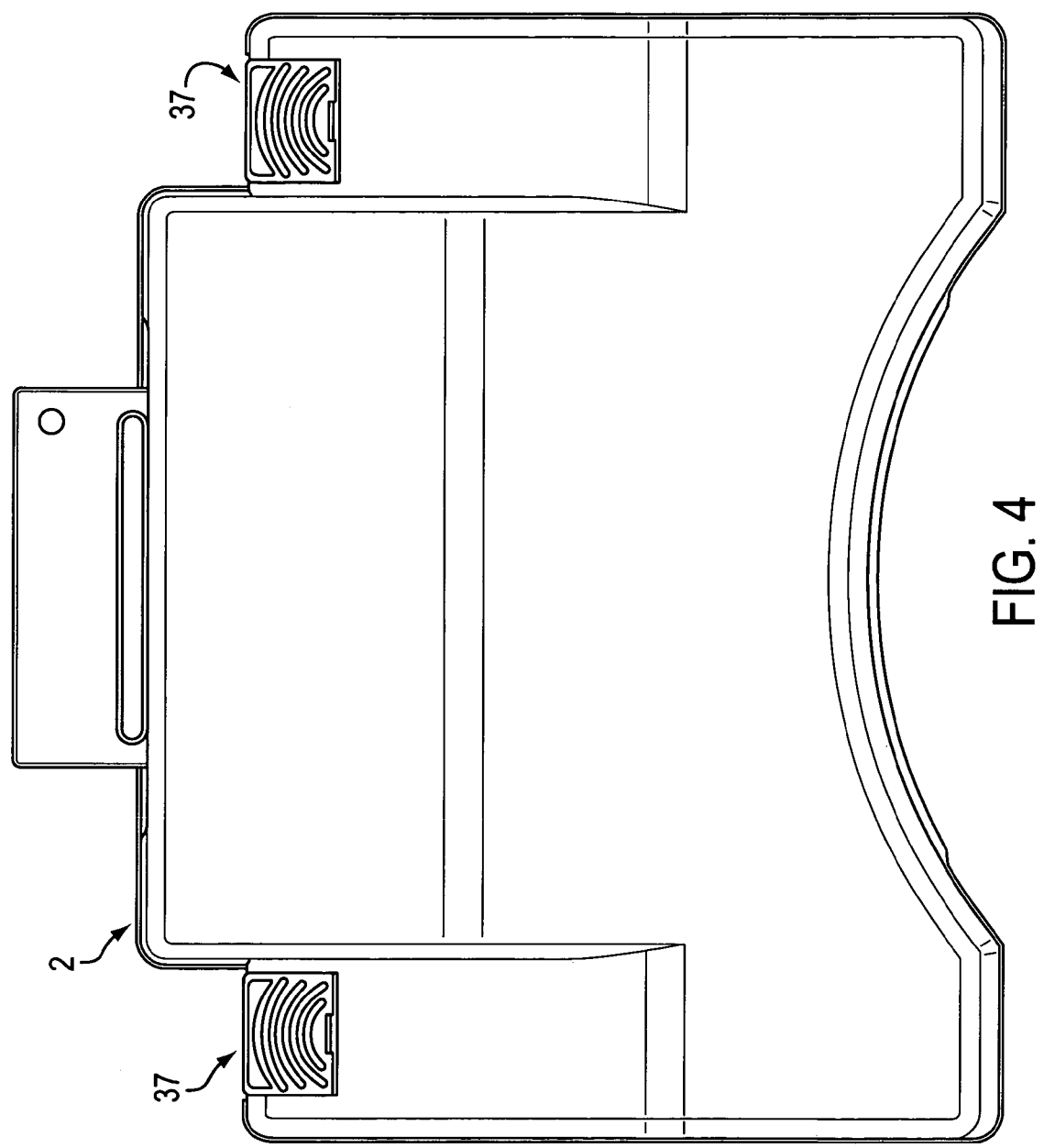
FIG. 4 is a planar view of a preferred embodiment of the present inventive module.

FIG. 4 provides a planar illustration of the present inventive module when two latches are inserted into the module. In the embodiment illustrated in FIG. 4, when the latch is completely inserted into the module 2 and engaged with the electronic device, the finger rest 37 portion of the latch is the only portion that is externally visible, while other portions of the latch are hidden or substantially hidden within the module 2.

Figure 5:
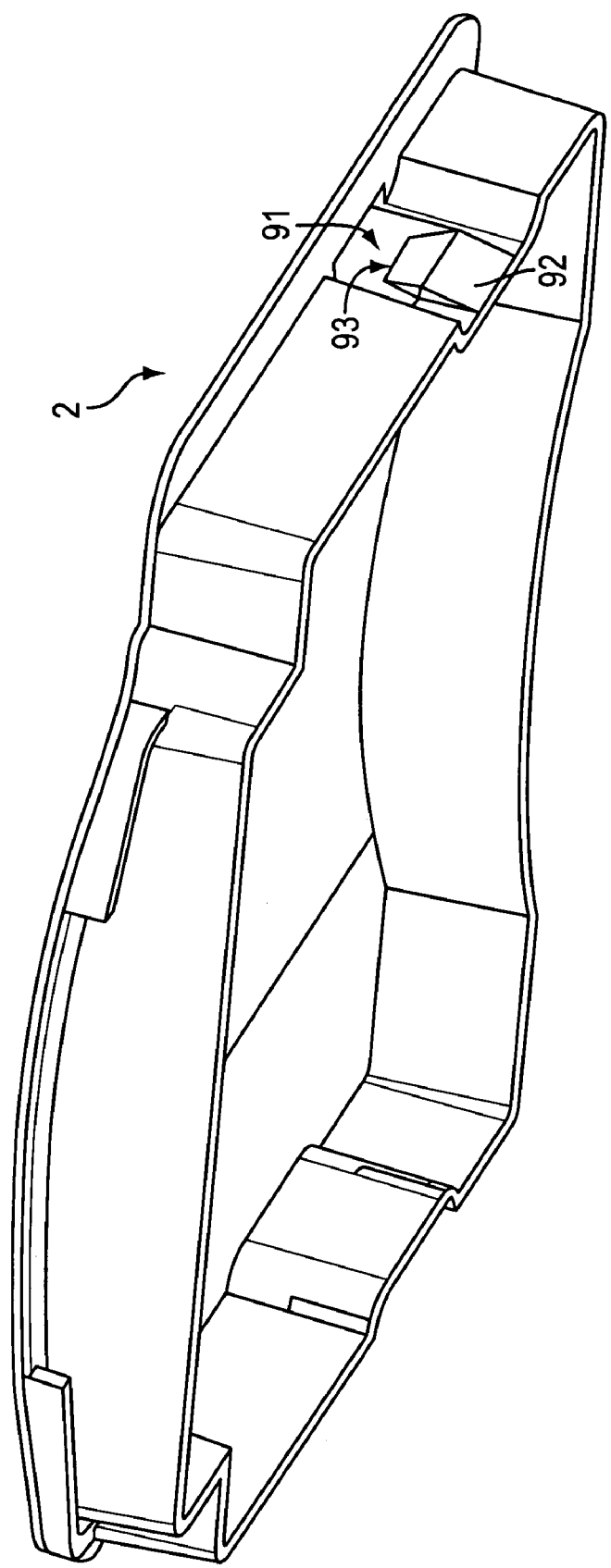
FIG. 5 is a perspective view of an alternate embodiment of the present inventive module illustrating an alternate latch.

FIG. 5 illustrates an alternate embodiment of a means to latch the housing to the electronic apparatus. Referring to FIG. 5, the housing to includes a locking finger 92 positioned at a point to mate with the notch (as illustrated by 9 of FIG. 1) of the portable electronic device when the housing is placed into the housing port of the electronic device. In this embodiment, the housing includes a space 91 to provide flexibility of the finger 92 so that the finger 92 may be squeezed and locked into the notch or receptacle of the electronic device. The finger 92 is preferably angled to come to a point 93 such that the housing may be removed from the electronic device with moderate force.

Figure 6:
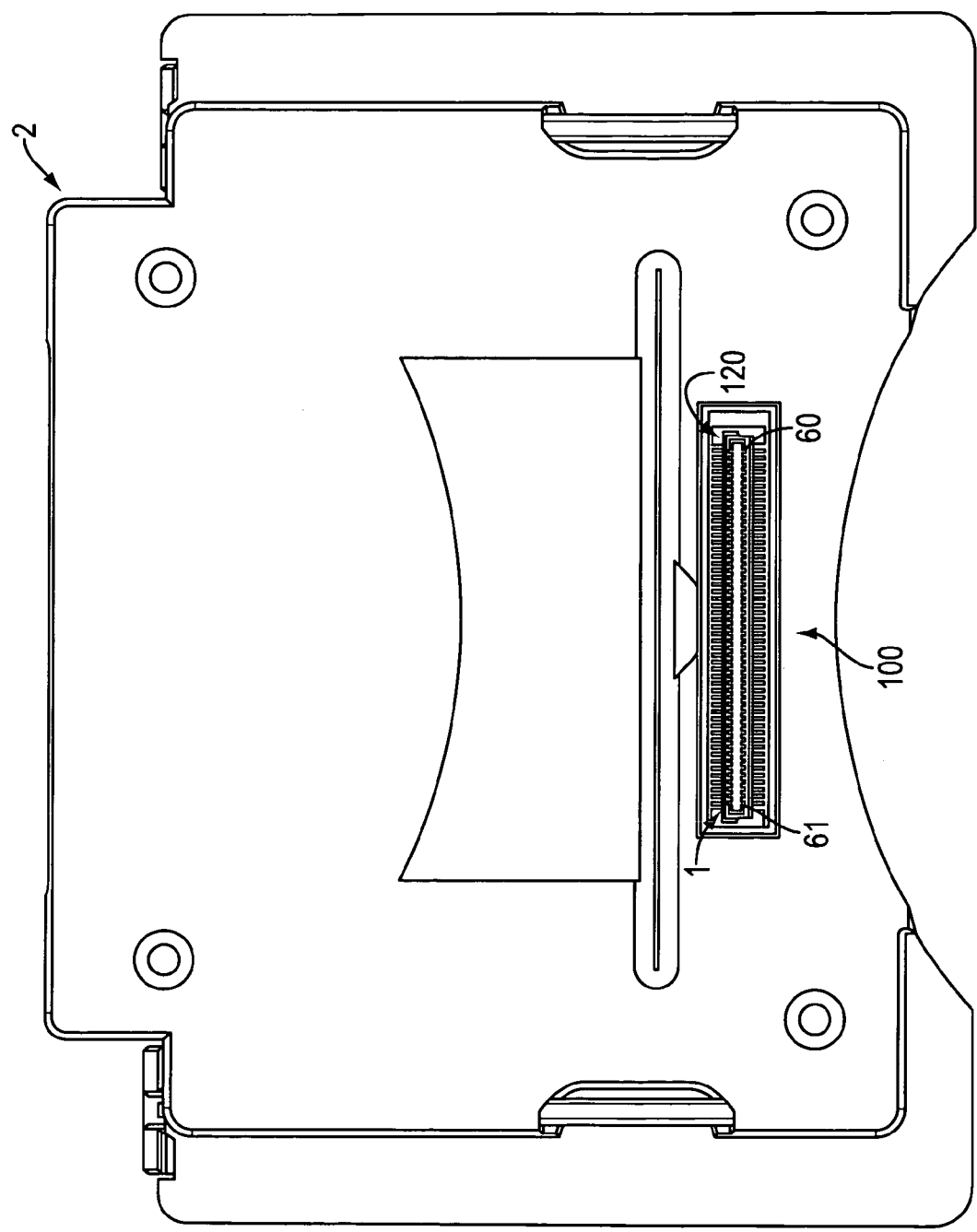
FIG. 6 is a planar view of a preferred embodiment of the present inventive module, illustrating a preferred electric connector.

The plug in module includes a memory or computer processor that adds functionality to the portable electronic device, or a means to connect such a memory or processor to the device. This functionality is delivered to the device through an electrical connector. An exemplary electrical connector is illustrated in FIG. 6. Referring to FIG. 6, electrical connector 100 is positioned within the module 2 and mates with the hardware interface port of the portable electronic device when the module 2 is attached to the electronic device. The electrical connector 100 includes up to 120 receptacles positioned to mate with the pins of the hardware interface port. The location and functionality of the receptacles of connector 100 are positioned to correspond to the functions of pins of the hardware interface port. In an alternate embodiment, the connector 100 includes pins and the hardware interface port of the electronic device includes receptacles.

FIG. 6 illustrates the numbering system for each receptacle. The interface connector has between 1 and 120 receptacles sized and positioned to receive and correspond to one or more pins of a hardware interface port on the portable electronic device. The receptacles on the connector form two rows in parallel such that each receptacle is positioned to be numbered corresponding to its position in one of the rows. One of the two rows includes receptacle positions 1 through 60, and the other of the two rows includes receptacle positions 61 through 120. Receptacle positions 1 and 61 are located at corresponding ends of each row, and receptacle positions 60 and 120 are located at the other corresponding ends of each row. Receptacle positions 1 and 120 are located at opposite ends of each row, and receptacle positions 60 and 61 are also located at opposite ends of each row. It is not necessary that the connector 100 contain all 120 receptacles. Rather, at least one receptacle must have corresponding functionality as follows:

In accordance with one embodiment of the present apparatus, at least one of the receptacles on the connector corresponds to at least one of positions 50, 56, 57, 58, 60, 61, 62, 64, 65, 66, 68, 69, 70, 72, 73, 74, 76, 77, 78, 80, 81, 82, 84, 85, 86, 88, 89, 105, 106, 108, and 110, and such receptacle or receptacles also correspond to a bus, such as a microprocessor interface bus, located within the portable electronic device.

In accordance with another embodiment of the present invention, at least one of the receptacles corresponds to at least one of positions 111, 112, 113, 114, 116, 118, and 120, and such receptacle or receptacles relate to power.

In accordance with another embodiment of the present invention, at least one of the receptacles corresponds to at least one of positions 3, 5, 7, 9, 11, 15, 19, 23, 27, 31, 35, 39, 47, 51, 55, 59, 63, 67, 71, 75, 79, 83, 87, 91, 95, 99, 103, 107, 109, 115, 117, and 119, and such receptacle or receptacles correspond to an electrical ground.

In accordance with another embodiment of the present invention at least one of the receptacles corresponds to at least one of positions 90, 92, 93, 96, 97, 100, 101, 102, 104, and 105, and such receptacle or receptacles correspond to a microprocessor discrete input/output.

In accordance with another embodiment of the present invention at least one of the receptacles corresponds to at least one of positions 2, 4, 6, 8, 10, 12-14, 16-18, 20-22, 24-26, 28-30, 32-34, 36-38 and 40, and such receptacle or receptacles correspond to a field programmable gate array (FPGA) discrete input/output.

The following chart illustrates the possible functionality of each pin and corresponding receptacle on the hardware interface port and electronic connector.

| Pin | Function |
|---|---|
| 1 | NC |
| 2 | HIP 1 (FPGA I/O) |
| 3 | Ground |
| 4 | HIP 2 (FPGA I/O) |

-continued

| Pin | Function |
|---|---|
| 5 | Ground |
| 6 | HIP 3 (FPGA I/O) |
| 7 | Ground |
| 8 | HIP 4 (FPGA I/O) |
| 9 | Ground |
| 10 | IRQ6A (FPGA I/O) |
| 11 | Ground |
| 12 | D0 (FPGA I/O) |
| 13 | D1 (FPGA I/O) |
| 14 | D2 (FPGA I/O) |
| 15 | Ground |
| 16 | D3 (FPGA I/O) |
| 17 | D4 (FPGA I/O) |
| 18 | D5 (FPGA I/O) |
| 19 | Ground |
| 20 | D6 (FPGA I/O) |
| 21 | D7 (FPGA I/O) |
| 22 | D8 (FPGA I/O) |
| 23 | Ground |
| 24 | D9 (FPGA I/O) |
| 25 | D10 (FPGA I/O) |
| 26 | D11 (FPGA I/O) |
| 27 | Ground |
| 28 | A12 (FPGA I/O) |
| 29 | A13 (FPGA I/O) |
| 30 | A14 (FPGA I/O) |
| 31 | Ground |
| 32 | NOT A15 (FPGA I/O) |
| 33 | EN (FPGA I/O) |
| 34 | WR (FPGA I/O) |
| 35 | Ground |
| 36 | NOT AS (FPGA I/O) |
| 37 | NOT CS4 (FPGA I/O) |
| 38 | NOT CSRAM (FPGA I/O) |
| 39 | Ground |
| 40 | CARIN FPGA I/O |
| 41 | NC |
| 42 | NC |
| 43 | Ground |
| 44 | NC |
| 45 | TD0 |
| 46 | TD1 |
| 47 | Ground |
| 48 | NC |
| 49 | TCK |
| 50 | NOT HRESET |
| 51 | Ground |
| 52 | ENETRXD |
| 53 | IC1 |
| 54 | IC2 |
| 55 | Ground |
| 56 | D(0) |
| 57 | D(1) |
| 58 | D(2) |
| 59 | Ground |
| 60 | D(3) |
| 61 | D(4) |
| 62 | D(5) |
| 63 | Ground |
| 64 | D(6) |
| 65 | D(7) |
| 66 | D(8) |
| 67 | Ground |
| 68 | D(9) |
| 69 | D(10) |
| 70 | D(11) |
| 71 | Ground |
| 72 | D(12) |
| 73 | D(13) |
| 74 | D(14) |
| 75 | Ground |
| 76 | D(15) |
| 77 | A(22) |
| 78 | A(23) |
| 79 | Ground |
| 80 | A(24) |
| 81 | A(25) |

-continued

| Pin | Function |
|---|---|
| 82 | A(26) |
| 83 | Ground |
| 84 | A(27) |
| 85 | A(28) |
| 86 | A(29) |
| 87 | Ground |
| 88 | A(30) |
| 89 | A(31) |
| 90 | PA(6) |
| 91 | Ground |
| 92 | PA(7) |
| 93 | PA(12) |
| 94 | NC |
| 95 | Ground |
| 96 | PC(8) |
| 97 | PC(9) |
| 98 | NC |
| 99 | Ground |
| 100 | PB(18) |
| 101 | PB(30) |
| 102 | PB(29) |
| 103 | Ground |
| 104 | PB(28) |
| 105 | NOT CSISI |
| 106 | READ/NOT WRIGHT |
| 107 | Ground |
| 108 | NOT SRESET |
| 109 | Ground |
| 110 | NOT TA |
| 111 | +3.3 V DC |
| 112 | +3.3 V DC |
| 113 | +5 V DC |
| 114 | +5 V DC |
| 115 | Ground |
| 116 | BATTERY B+ |
| 117 | Ground |
| 118 | BATTERY B+ |
| 119 | Ground |
| 120 | EXT +12 V DC |

Figure 7:
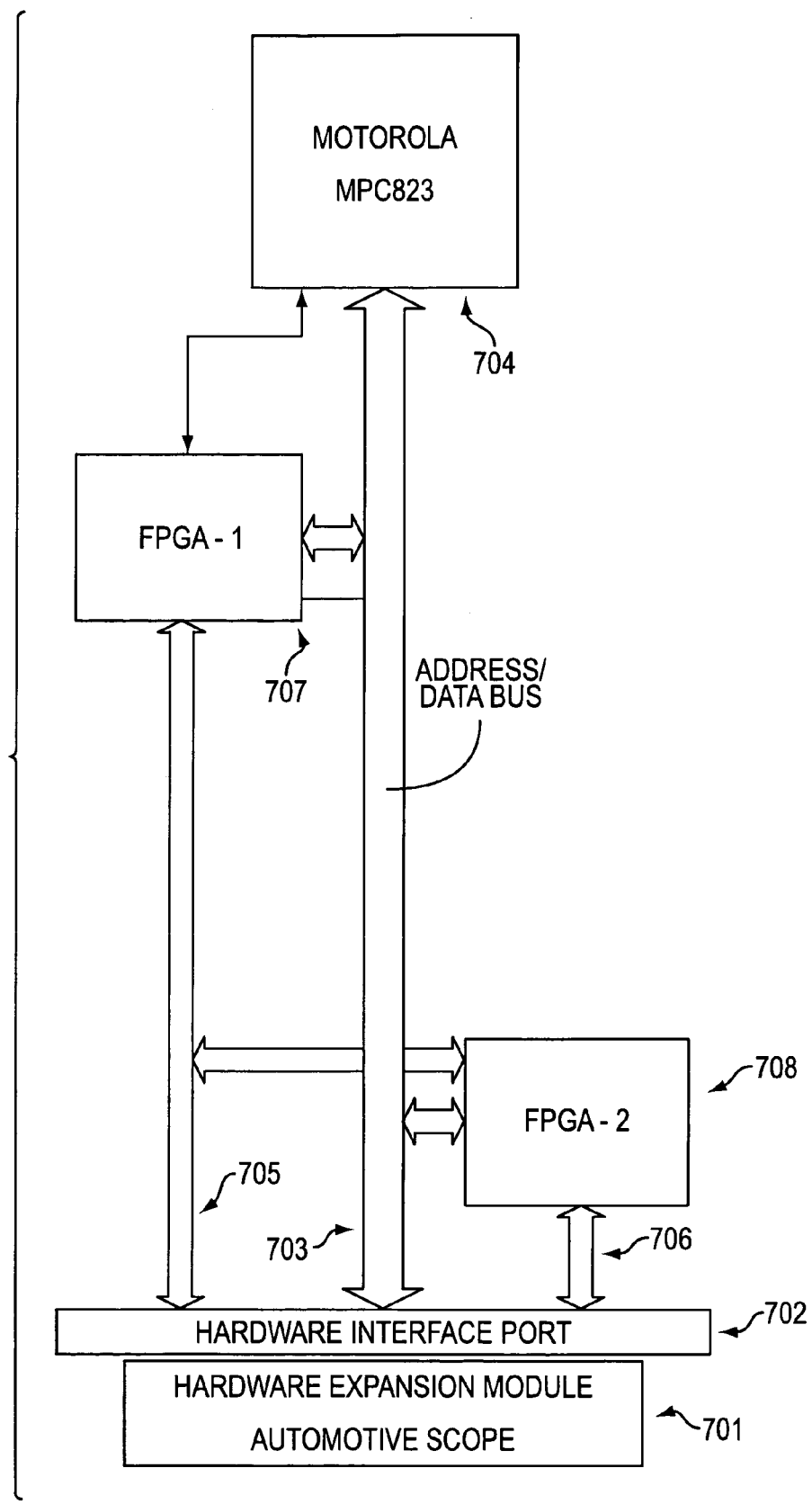
FIG. 7 is a block diagram illustrating the exemplary hardware of an electronic device with which the present inventive module may interface.

FIG. 7 illustrates the internal components of an exemplary electronic device. Such components may interface with the module through the hardware interface port. Referring to FIG. 7, a hardware expansion module 701 such as that in an automotive scope interfaces with a hardware interface port 702. Certain pins or receptacles on the hardware interface port 702 provide communication to and from the controller 704 via interface bus 703 within the portable electronic device. The hardware interface port 702 may also serve to communicate discrete input/output signals via interface bus 703 to the expansion module, and the expansion module may share input/output signals 705 and/or 706 with one or more FPGA components within the electronic device such as 707 and/or 708.

In order to provide a shock-resistant plug-in module, it may be desirable to incorporate an elastomeric member to absorb or reduce shock when the unit is dropped or otherwise subjected to an impact. At least one such member is described in the co-pending U.S. patent application Ser. No. 09/702,801, entitled "Shock Absorbing Apparatus," which is hereby incorporated by reference in its entirety.

The many features and advantages of the invention are apparent from the detailed specification, and thus, it is intended by the appended claims to cover all such features and advantages of the invention which fall within the true spirits and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A portable electronic device for use in servicing a vehicle, comprising:
    a handheld computing device for servicing the vehicle having a device housing and device electronic components;
    a module having a module housing and module electronic components, wherein the module housing is constructed and arranged to directly couple with the device housing, and wherein the module electronic components communicate with the device electronic components when the module housing is directly coupled with the device housing; and
    a cartridge having a cartridge housing and cartridge electronic components, wherein the cartridge housing is constructed and arranged to directly couple with the module housing, and wherein the cartridge electronic components communicate with the module electronic components and the device electronic components when the cartridge housing is directly coupled with the module housing and the module housing is directly coupled with the device housing;
    wherein said module provides additional functionality to said handheld computing device; and
    wherein said cartridge provides additional functionality to said module.

2. The apparatus of claim 1, wherein said module housing includes at least one latch for securing the module housing to the device housing.

3. The apparatus of claim 2, wherein the device housing includes at least one receptacle to receive the at least one latch.

4. The apparatus of claim 2, wherein the at least one latch has a first member, a second member, and a third member, each of the members having a first end and a second end, wherein the first end of the first member is connected to the first end of the second member such that the first member and the second member form an angle of between 60 degrees and 130 degrees, and wherein the second end of the first member is connected to the first end of the third member such that the first member and the third member form an angle of between 60 degrees and 130 degrees.

5. The apparatus of claim 2, wherein the at least one latch includes a locking finger constructed and arranged to flexibly mate with a formation located on an interior side surface of the device housing.

6. The apparatus of claim 2, wherein the at least one latch includes a slip-resistant surface, sized to accept a human finger or thumb.

7. The apparatus of claim 2, wherein the at least one latch includes a first formation substantially at a point where a first member of the at least one latch connects to a second member of the at least one latch; and wherein the first formation of the at least one latch is constructed and arranged to engage a second formation located on a surface of the device housing.

8. The apparatus of claim 1, wherein the cartridge electronic components include a computer processor.

9. The apparatus of claim 1, wherein the cartridge electronic components include a computer memory.

10. The apparatus of claim 1, wherein the module electronic components include a computer processor.

11. The apparatus of claim 1, wherein the module electronic components include a computer memory.

12. A means for servicing a vehicle using a portable electronic device, comprising:
    a means for handheld computing for servicing the vehicle having a housing means and an electronic means;
    a means for providing primary modular functionality having a housing means and an electronic means, wherein the housing means of the means for providing primary modular functionality is designed to directly couple with the housing means of the means for handheld computing, wherein the electronic means of the means for providing primary modular functionality communicates with the electronic means of the means for handheld computing when the housing means of the means for providing primary modular functionality is directly coupled with the housing means of the means for handheld computing; and
    a means for providing secondary modular functionality having a housing means and an electronic means, wherein the housing means of the means for providing secondary modular functionality is designed to directly couple with the housing means of the means for providing primary modular functionality, and wherein the electronic means of the means for providing secondary modular functionality communicates with the electronic means of the means for providing primary modular functionality and the electronic means of the means for handheld computing when the housing means of the means for providing secondary modular functionality is directly coupled with the housing means of the means for providing primary modular functionality and the means for providing primary modular functionality is directly coupled to the means for handheld computing;
    wherein the means for providing primary modular functionality provides additional functionality to the means for handheld computing; and
    wherein the means for providing secondary modular functionality provides additional functionality to the means for providing primary modular functionality.

13. The apparatus of claim 12, wherein the housing means of the means for providing primary modular functionality includes means for securing the housing means of the means for providing primary modular functionality to the housing means of the means for handheld computing.

14. The apparatus of claim 13, wherein the housing means of the means for handheld computing includes means for receiving the means for securing.

15. The apparatus of claim 13, wherein the means for securing has a first member, a second member, and a third member, each of the members having a first end and a second end, and wherein the first end of the first member is connected to the first end of the second member such that the first member and the second member form an angle of between 60 degrees and 130 degrees, and wherein the second end of the first member is connected to the first end of the third member such that the first member and the third member form an angle of between 60 degrees and 130 degrees.

16. The apparatus of claim 13, wherein the means for securing includes means for mating constructed and arranged to flexibly mate with means for mating located on an interior side surface of the housing means of the means for handheld computing.

17. The apparatus of claim 13, wherein the means for securing includes means for accepting a human finger or thumb, having a slip-resistant surface.

18. The apparatus of claim 13, wherein the means for securing includes a means for complementary engagement substantially at a point where a first member of the means for securing connects to a second member of the means for securing; and wherein the means for complementary engagement of the means for securing is constructed and arranged to engage a means for complementary engagement located on a surface of the housing means of the means for handheld computing.

19. The apparatus of claim 12, wherein the electronic means includes means for computer processing.

20. The apparatus of claim 12, wherein the electronic means includes means for storing data.

* * * * *

UNITED STATES PATENT AND TRADEMARK OFFICE
CERTIFICATE OF CORRECTION

| | | |
|---|---|---|
| PATENT NO. | : 7,324,346 B2 | Page 1 of 1 |
| APPLICATION NO. | : 11/217466 | |
| DATED | : January 29, 2008 | |
| INVENTOR(S) | : Durval S. Ribeiro et al. | |

It is certified that error appears in the above-identified patent and that said Letters Patent is hereby corrected as shown below:

Title Page item 62
Please insert the following related U.S. application data:

--This application is a divisional of and claims priority to U.S. Application No. 09/702,750, filed on November 1, 2000, now U.S. Patent No. 7,050,306, which claims priority to U.S. Provisional Application No. 60/240,859, filed on October 17, 2000--;

Column 1 (Claim of Priority) line 6
Please replace "This application claims priority to the provisional application Ser. No. 60/240,859 entitled "Plug-In Module for Portable Computing Device," filed October 17, 2000, the disclosure of which is hereby incorporated by reference in its entirety" with --This application is a divisional of and claims priority to U.S. Application No. 09/702,750, filed on November 1, 2000, now U.S. Patent No. 7,050,306, which claims priority to U.S. Provisional Application No. 60/240,859, filed on October 17, 2000, the disclosures of which are hereby incorporated by reference in their entirety--.

Signed and Sealed this

Thirtieth Day of December, 2008

JON W. DUDAS
*Director of the United States Patent and Trademark Office*